(12) United States Patent
Zhou et al.

(10) Patent No.: US 11,349,043 B2
(45) Date of Patent: May 31, 2022

(54) METHOD FOR MANUFACTURING TILTED MESA AND METHOD FOR MANUFACTURING DETECTOR

(71) Applicant: THE 13TH RESEARCH INSTITUTE OF CHINA ELECTRONICS TECHNOLOGY GROUP CORPORATION, Shijiazhuang (CN)

(72) Inventors: Xingye Zhou, Shijiazhuang (CN); Zhihong Feng, Shijiazhuang (CN); Yuanjie Lv, Shijiazhuang (CN); Xin Tan, Shijiazhuang (CN); Xubo Song, Shijiazhuang (CN); Jia Li, Shijiazhuang (CN); Yulong Fang, Shijiazhuang (CN); Yuangang Wang, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 17/031,608

(22) Filed: Sep. 24, 2020

(65) Prior Publication Data

US 2021/0020801 A1    Jan. 21, 2021

Related U.S. Application Data

(63) Continuation of application No. PCT/CN2018/112426, filed on Oct. 29, 2018.

(30) Foreign Application Priority Data

May 4, 2018    (CN) .......................... 201810420959.9

(51) Int. Cl.
*H01L 31/18*    (2006.01)
*H01L 31/0224*    (2006.01)
(Continued)

(52) U.S. Cl.
CPC .. *H01L 31/1812* (2013.01); *H01L 31/022408* (2013.01); *H01L 31/0312* (2013.01); *H01L 31/035281* (2013.01); *H01L 31/107* (2013.01)

(58) Field of Classification Search
CPC ...................... H01L 31/035281; H01L 31/107
See application file for complete search history.

(56) References Cited

U.S. PATENT DOCUMENTS

2004/0108530 A1    6/2004    Sandvik et al.

FOREIGN PATENT DOCUMENTS

| CN | 104882510 A | 9/2015 |
|---|---|---|
| CN | 206672951 U | 11/2017 |

(Continued)

OTHER PUBLICATIONS

E. Chong et al., "Effect of beveled mesa angle on the leakage performance of 4H-SiC avalanche photodiodes", Feb. 28, 2019, Solid State Electronics, vol. 156, pp. 1-4.*

(Continued)

*Primary Examiner* — Suberr L Chi
(74) *Attorney, Agent, or Firm* — Slater Matsil, LLP

(57) ABSTRACT

The disclosure is related to the technical field of semiconductors, and provides a method for manufacturing a tilted mesa and a method for manufacturing a detector. The method for manufacturing a tilted mesa comprises: coating a photoresist layer on a mesa region of a chip; heating the chip on which the photoresist layer is coated from a first preset temperature to a second preset temperature; performing etching processing on the heated chip, so as to manufacture a mesa having a preset tilting angle; and removing the photoresist layer on the mesa region of the chip after the mesa is manufactured.

15 Claims, 3 Drawing Sheets

(51) Int. Cl.
*H01L 31/0312* (2006.01)
*H01L 31/0352* (2006.01)
*H01L 31/107* (2006.01)

(56) References Cited

FOREIGN PATENT DOCUMENTS

| CN | 107611193 A | 1/2018 |
|---|---|---|
| CN | 107910360 A | 4/2018 |
| CN | 108630778 A | 10/2018 |

OTHER PUBLICATIONS

D. Zhou et al., "High-temperature single photon detection performance of 4H-SiC avalanche photodiodes", Apr. 11, 2014, IEEE Photonics Tech. Letters, vol. 26, pp. 1136-1138.*

* cited by examiner

METHOD FOR MANUFACTURING TILTED MESA AND METHOD FOR MANUFACTURING DETECTOR

CROSS-REFERENCE TO RELATED APPLICATIONS

This application is a continuation application of International Application No. PCT/CN2018/112426, filed on Oct. 29, 2018, which claims priority to Chinese Patent Application No. CN201810420959.9, filed on May 4, 2018. The disclosures of the aforementioned applications are hereby incorporated herein by reference in their entireties.

TECHNICAL FIELD

The disclosure relates to the technical field of semiconductors, and in particular to a method for manufacturing a tilted mesa and a method for manufacturing a detector.

BACKGROUND

Since the ultraviolet radiation with a wavelength in the range from 100 nm to 280 nm is absorbed and blocked by the ozone layer to a very low level near the earth, solar-blind ultraviolet detectors have advantages such as low background noise from visible to infrared radiation, low false warning rate, etc., which are very important and promising in the applications of ultraviolet warning, ultraviolet communication, ultraviolet astronomy, and so on.

The ultraviolet detector with a positively tilted mesa can effectively suppress the pre-breakdown of the device. In addition, the smaller the angle of the tilted mesa is, the better the withstand voltage characteristics of the device are. Generally, the tilted mesa with a positive angle is formed through a photoresist reflow process. At present, the photoresist reflow process for forming the mesa is performed by heating at a fixed high temperature. For example, a photoresist layer is coated on a chip, and then the chip is placed on a heating plate with a constant high temperature to reflow the photoresist quickly. However, the resulted mesa after etching based on this process may have a saw-toothed sidewall, which increases the surface leakage current of the device.

SUMMARY

These and other problems are generally solved or circumvented, and technical advantages are generally achieved, by embodiments of the present disclosure which provide a method for manufacturing a tilted mesa and a method for manufacturing a detector.

Embodiments of the disclosure provide a method for manufacturing a tilted mesa and a method for manufacturing a detector, for solving the problem in the conventional art that a saw-toothed sidewall occurs on the prepared positively tilted mesa and increases the surface leakage current of the device.

A first aspect of the embodiments of the disclosure provides a method for manufacturing a tilted mesa, comprising the following steps: coating a photoresist layer on a mesa region of a chip; heating the chip on which the photoresist layer is coated from a first preset temperature to a second preset temperature; performing etching processing on the heated chip, so as to manufacture a mesa having a preset tilting angle; and removing the photoresist layer on the mesa region of the chip after the mesa is manufactured.

In one embodiment, performing the etching processing on the heated chip comprises: performing multiple cycled dry etchings on the heated chip.

In one embodiment, heating the chip on which the photoresist layer is coated from the first preset temperature to the second preset temperature comprises: heating the chip on which the photoresist layer is coated from the first preset temperature to the second preset temperature within 2-20 minutes, and the first preset temperature is in a range from 80° C. to 100° C., and the second preset temperature is in a range from 140° C. to 200° C.

In one embodiment, the chip comprises in sequence from bottom to top a substrate, a silicon carbide $P^+$ layer, a silicon carbide N layer, a silicon carbide $N^-$ layer, and a silicon carbide $N^+$ layer; or the chip comprises in sequence from bottom to top the substrate, the silicon carbide $P^+$ layer, the silicon carbide $N^-$ layer, and the silicon carbide $N^+$ layer; or the chip comprises in sequence from bottom to top the substrate, the silicon carbide $P^+$ layer, and the silicon carbide N layer.

In one embodiment, the substrate is a silicon carbide substrate.

In one embodiment, the preset tilting angle of the mesa is less than 20 degrees.

A second aspect of the embodiments of the disclosure provides a method for manufacturing a detector, comprising the following steps: manufacturing a mesa on a chip by the method provided in the first aspect of the embodiments of the disclosure; manufacturing ohmic contact electrodes on ohmic contact electrode areas of the chip with the manufactured mesa; and forming a passivation layer on a side surface of the mesa and an upper surface excluding the ohmic contact electrode areas of the chip.

In one embodiment, the passivation layer is one or more selected from a silicon oxide layer, an aluminum oxide layer, a chromium oxide layer, an yttrium oxide layer and a silicon nitride layer.

In one embodiment, a thickness of the passivation layer is in a range from 50 nanometers to 500 nanometers.

In one embodiment, a material of the ohmic contact electrodes is one or more selected from nickel, titanium, aluminum and gold.

Compared with the conventional art, the embodiments of the disclosure have the following beneficial effects: by heating the chip coated with the photoresist layer through a variable temperature heating process from low temperatures to high temperatures, the photoresist reflows to form a smooth slope of the sidewall. Subsequent, the mesa with a small tilting angle is manufactured by performing multiple cycled dry etchings. The sidewall of the mesa can be very smooth, such that leakage current on the surface of a device is reduced.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to more clearly illustrate technical solutions in embodiments of the disclosure, the accompanying drawings for description of the embodiments or the conventional art are introduced below. It is apparent that the accompanying drawings in the following description are only some illustrative embodiments of the disclosure. For those skilled in the art, other drawings can also be obtained according to these accompanying drawings without paying creative effort.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

For illustration not for limiting, the following description presents specific details like specific system structures and technologies, so as to fully understand the embodiments of the disclosure. However, those skilled in the art should know that the disclosure may also be implemented in other embodiments without these specific details. In other cases, the detailed descriptions of the well-known systems, devices, circuits and methods are omitted for the sake of brevity.

For illustrative purpose, the technical solutions of the disclosure are illustrated below through specific Examples.

Example 1

Figure 1:
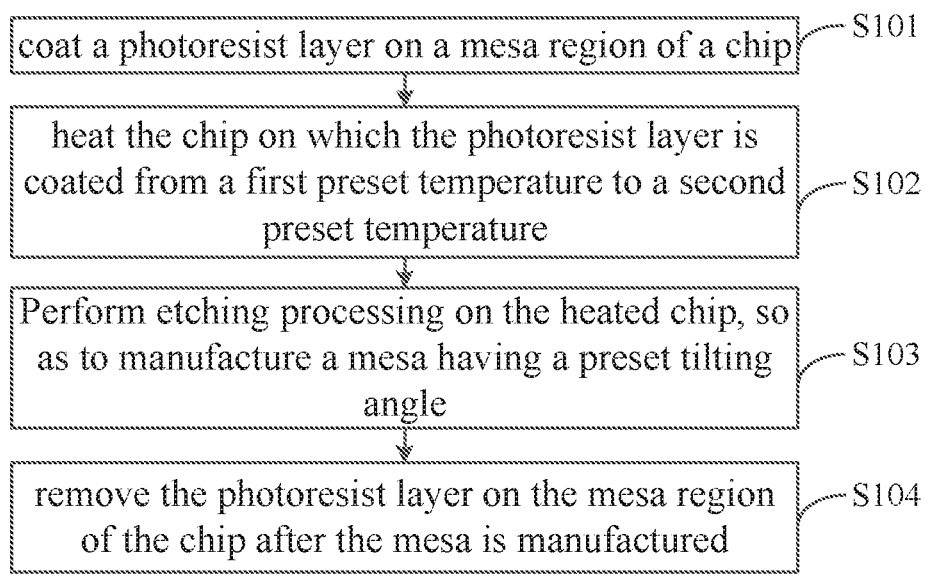
FIG. 1 is a flow diagram of a method for manufacturing a tilted mesa provided by an embodiment of the disclosure.

Referring to FIG. 1, an embodiment method for manufacturing a tilted mesa comprising the following steps:

At S101, coating a photoresist layer on a mesa region of a chip.

Figure 2:
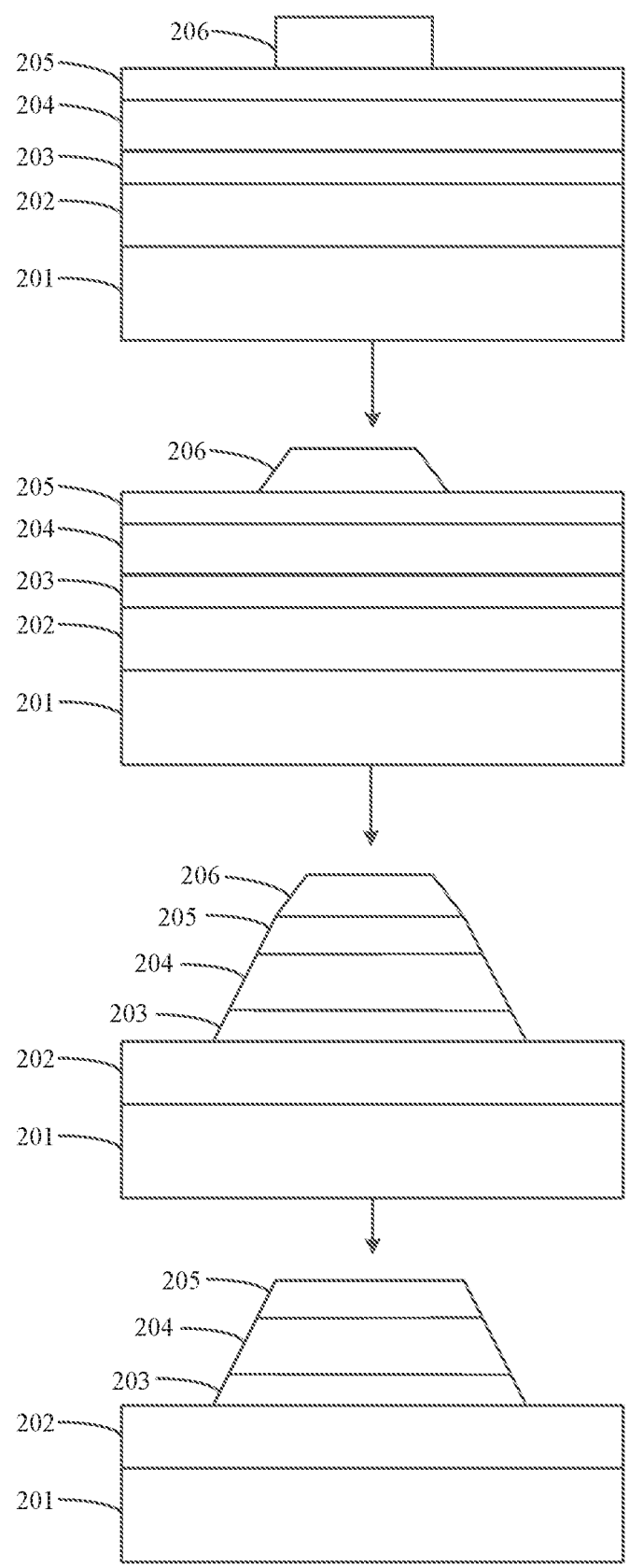
FIG. 2 is a section view of a structure of a tilted mesa provided by an embodiment of the disclosure.

In the embodiments of the disclosure, the chip may be a silicon carbide chip, a gallium nitride chip or other chips capable of manufacturing avalanche photodiodes. Preferably, the chip is the silicon carbide chip. A silicon carbide material is a preferred material for manufacturing an ultraviolet photodetector due to the advantages such as wide bandgap, good thermal conductivity, high electron saturation drift velocity, stable chemical property and low defect density. The mesa area of the chip is the area where the manufactured mesa locates. Referring to FIG. 2, a photoresist layer 206 is coated on the mesa area of the chip through the spin coating method.

In one embodiment, the chip comprises a top side and a bottom side, and the chip comprises in sequence from the bottom side to the top side: a substrate, a silicon carbide P$^+$ layer, a silicon carbide N layer, a silicon carbide N$^-$ layer, and a silicon carbide N$^+$ layer. Alternatively, the chip comprises in sequence from the bottom side to the top side: the substrate, the silicon carbide P$^+$ layer, the silicon carbide N$^-$ layer, and the silicon carbide N$^+$ layer. Alternatively, the chip comprises in sequence from the bottom side to the top side: the substrate, the silicon carbide P$^+$ layer, and the silicon carbide N layer.

In the embodiments of the disclosure, the silicon carbide P$^+$ layer is a heavy-doped silicon carbide P type layer, the silicon carbide N$^-$ layer is a light-doped silicon carbide N type layer, and the silicon carbide N$^+$ layer is a heavy-doped silicon carbide N type layer. In an embodiment, as illustrated in FIG. 2, the chip comprises in sequence from bottom to top: the substrate 201, the silicon carbide P$^+$ layer 202, the silicon carbide N layer 203, the silicon carbide N$^-$ layer 204, and the silicon carbide N$^+$ layer 205. A doping concentration of the silicon carbide P$^+$ layer 202 is $1\times10^{18}$ cm$^{-3}$ to $1\times10^{20}$ cm$^{-3}$; a doping concentration of the silicon carbide N layer 203 is $1\times10^{17}$ cm$^{-3}$ to $5\times10^{18}$ cm$^{-3}$; a doping concentration of the silicon carbide N$^-$ layer 204 is $1\times10^{15}$ cm$^{-3}$ to $1\times10^{17}$ cm$^{-3}$; and a doping concentration of the silicon carbide N$^+$ layer 205 is $1\times10^{18}$ cm$^{-3}$ to $1\times10^{20}$ cm$^{-3}$. In another embodiment, the chip comprises in sequence from bottom to top: the substrate, the silicon carbide P$^+$ layer, the silicon carbide N$^-$ layer, and the silicon carbide N$^+$ layer, forming a PIN structure in which the doping concentration of the silicon carbide P$^+$ layer is $1\times10^{18}$ cm$^{-3}$ to $1\times10^{20}$ cm$^{-3}$, the doping concentration of the silicon carbide N$^-$ layer is $1\times10^{15}$ cm$^{-3}$ to $1\times10^{17}$ cm$^{-3}$, and the doping concentration of the silicon carbide N$^+$ layer is $1\times10^{18}$ cm$^{-3}$ to $1\times10^{20}$ cm$^{-3}$. In another embodiment, the chip comprises in sequence from bottom to top: the substrate, the silicon carbide P$^+$ layer, and the silicon carbide N layer, forming a PN structure in which the doping concentration of the silicon carbide P$^+$ layer is $1\times10^{18}$ cm$^{-3}$ to $1\times10^{20}$ cm$^{-3}$, and the doping concentration of the silicon carbide N layer is $5\times10^{17}$ cm$^{-3}$ to $1\times10^{20}$ cm$^{-3}$.

At S102, heat the chip on which the photoresist layer is coated from a first preset temperature to a second preset temperature.

In the embodiments of the disclosure, a temperature of a heating plate is increased to the first preset temperature. The chip is then placed on the heating plate and heated by the heating plate, while the temperature of the heating plate is gradually increased to the second preset temperature. After the heating plate reaches the second preset temperature, the chip is removed from the heating plate. The increase from the first preset temperature to the second preset temperature may be a linear temperature rising process or a non-linear temperature rising process, which is not limited by the embodiments of the disclosure. As illustrated in FIG. 2, the photoresist layer 206 forms a smooth slope upon being heated under variable temperatures.

In one embodiment, S102 is performed as follows: heating the chip on which the photoresist layer is coated from the first preset temperature to the second preset temperature within 2-20 minutes; the first preset temperature is 80° C. to 100° C., and the second preset temperature is 140° C. to 200° C.

In the embodiments of the disclosure, the temperature of the heating plate is increased to a certain temperature between 80° C. and 100° C. at first. The chip is then placed on the heating plate, while the temperature of the heating plate is continuously increased to a certain temperature between 140° C. and 200° C. within 2 minutes to 20 minutes. After then, the chip is removed from the heating plate. During the heating process, the photoresist layer on the chip reflows to form the smooth slope. In the embodiments of the disclosure, if the initial temperature of the heating plate is lower than 80° C., the photoresist will reflow too slowly and a time for reflowing is too long; if the initial temperature of the heating plate is higher than 200° C., it will cause the photoresist to carbonize or degrade. The time for heating the chip is controlled within 2 minutes to 20 minutes. If the time for heating is too short, the positive angle of the tilted mesa will be too large, which is negative for suppressing pre-breakdown of the device; if the time for heating is too long, it will cause the photoresist to become hard and even carbonized.

At S103, perform etching processing on the heated chip, so as to manufacture a mesa having a preset tilting angle.

In the embodiments of the disclosure, as illustrated in FIG. 2, the chip after heated is etched to the silicon carbide $P^+$ layer 202, forming the mesa.

In one embodiment, S103 is performed as follows: the chip after heated is performed multiple cycled dry etchings.

In the embodiments of the disclosure, multiple cycled etchings may reduce the etching damage on the surface of the device. The number of etchings may be 2 to 50, and the time for each etching is 30 seconds to 3 minutes.

At S104, remove the photoresist layer on the mesa region of the chip after the mesa is manufactured.

In one embodiment, the tilting angle of the mesa is less than 20 degrees.

In the embodiments of the disclosure, by heating the chip coated with the photoresist layer through a variable temperature heating process from low temperatures to high temperatures, the photoresist reflows to form a smooth slope of the sidewall. Subsequent, the mesa with a small tilting angle is manufactured by performing multiple cycled dry etchings. The sidewall of the mesa can be very smooth, such that leakage current on the surface of a device is reduced.

Example 2

Figure 3:
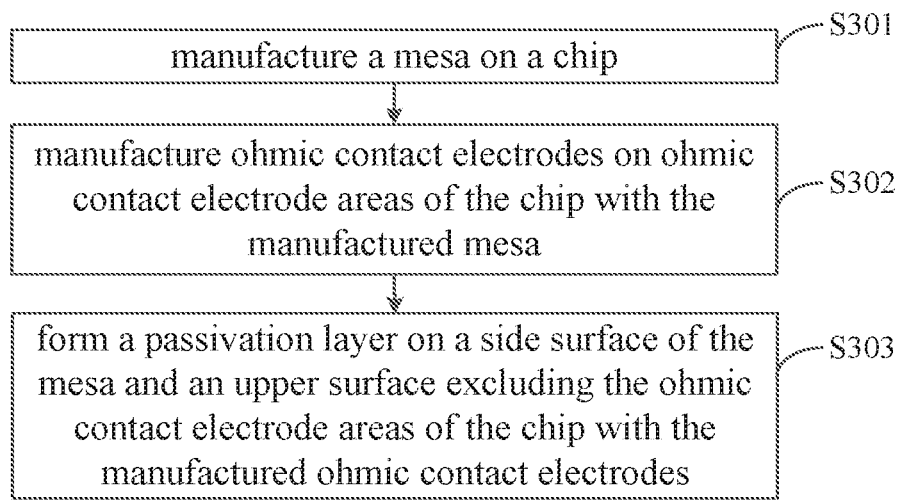
FIG. 3 is a flow diagram of a method for manufacturing a detector provided by an embodiment of the disclosure.

Referring to FIG. 3, an embodiment method for manufacturing a detector comprising the following steps:

At S301, manufacturing a mesa on a chip by the method of Example 1 of the disclosure.

In the embodiments of the disclosure, referring to FIG. 2, the mesa formed on the chip by the method of Example 1 has the preset tilting angle and smooth sidewall.

At S302, manufacture ohmic contact electrodes on ohmic contact electrode areas of the chip with the manufactured mesa.

Figure 4:
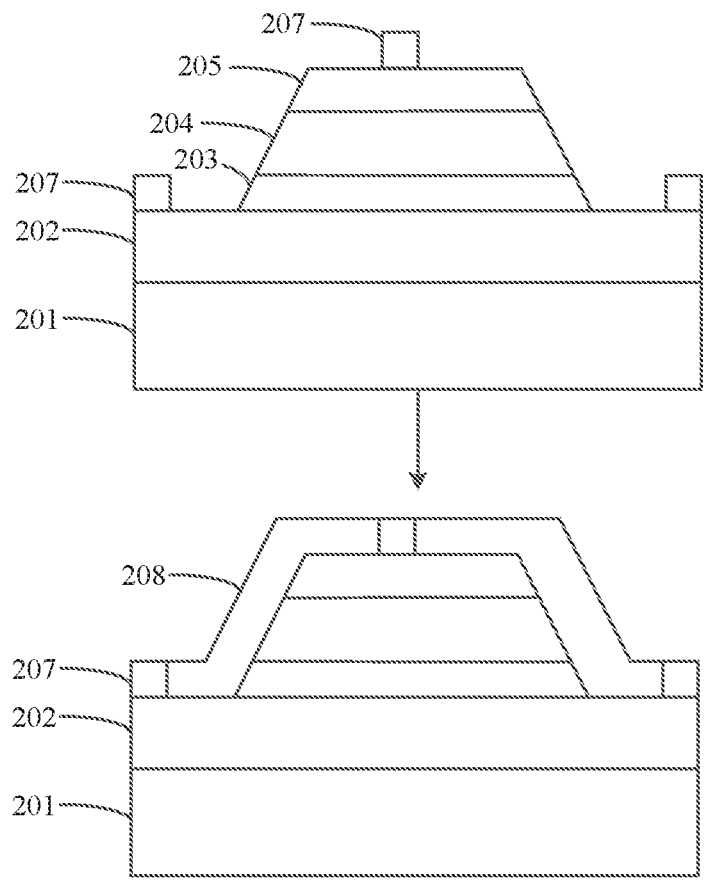
FIG. 4 is a section view of a structure of a detector provided by an embodiment of the disclosure.

In the embodiments of the disclosure, referring to FIG. 4, the ohmic contact electrodes 207 are located at the upper surface of the mesa and the upper surface of a non-mesa area. The non-mesa area is the area of the chip excluding the mesa area. The ohmic contact electrode 207 on the upper surface of the mesa is an N type electrode, and the ohmic contact electrode 207 on the upper surface of the non-mesa area is a P type ring electrode surrounding the mesa. Specifically, the ohmic contact electrodes 207 are formed as follows: a photoresist layer is coated on the area of the chip excluding the ohmic contact electrode area through a photolithography process; a metal layer is deposited on the ohmic contact electrode area of the chip through an evaporation process; the photoresist layer is removed; and an annealing treatment is performed.

In one embodiment, a material of the ohmic contact electrode 207 is one or more selected from nickel, titanium, aluminum and gold.

At S303, form a passivation layer on a side surface of the mesa and an upper surface excluding the ohmic contact electrode areas of the chip with the manufactured ohmic contact electrodes.

In the embodiments of the disclosure, referring to FIG. 4, the passivation layer 208 is arranged on the upper surface of the chip with the manufactured ohmic contact electrodes and the side surface of the mesa. The passivation layer 208 is removed from the upper surface of the ohmic contact electrodes through the photolithography process and the etching process, thereby a detector is fabricated.

In the embodiments of the disclosure, by heating the chip coated with the photoresist layer through a variable temperature heating process from low temperatures to high temperatures, the photoresist reflows to form a smooth slope of the sidewall. Subsequent, the mesa with a small tilting angle is manufactured by performing multiple cycled dry etchings. The sidewall of the mesa can be very smooth, such that leakage current on the surface of a device is reduced.

It should be understood that the step numbers in the above Examples do not mean a sequence of performing steps, and the sequence of performing steps should be determined by their functions and an internal logic. The step numbers should not limit the preparation method of the embodiments of the disclosure.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method for manufacturing a tilted mesa, comprising:
    coating a photoresist layer on a mesa region of a chip;
    heating the chip on which the photoresist layer is coated from a first preset temperature to a second preset temperature;
    performing etching processing on the heated chip, so as to manufacture a mesa having a preset tilting angle; and
    removing the photoresist layer on the mesa region of the chip after the mesa is manufactured; and
    wherein heating the chip on which the photoresist layer is coated from the first preset temperature to the second preset temperature comprises:
        heating the chip on which the photoresist layer is coated from the first preset temperature to the second preset temperature within 2-20 minutes, wherein the first preset temperature is in a range from 80° C. to 100° C., and the second preset temperature is in a range from 140° C. to 200° C.

2. The method of claim 1, wherein performing the etching processing on the heated chip comprises performing multiple cycled dry etchings on the heated chip.

3. The method of claim 2, wherein the preset tilting angle of the mesa is less than 20 degrees.

4. The method of claim 1, wherein the preset tilting angle of the mesa is less than 20 degrees.

5. The method of claim 1, wherein:
the chip comprises in sequence from bottom to top: a substrate, a silicon carbide $P^+$ layer, a silicon carbide N layer, a silicon carbide $N^-$ layer, and a silicon carbide $N^+$ layer; or
the chip comprises in sequence from bottom to top: the substrate, the silicon carbide $P^+$ layer, the silicon carbide $N^-$ layer, and the silicon carbide $N^+$ layer; or
the chip comprises in sequence from bottom to top: the substrate, the silicon carbide $P^+$ layer, and the silicon carbide N layer.

6. The method of claim 5, wherein the preset tilting angle of the mesa is less than 20 degrees.

7. The method of claim 5, wherein the substrate is a silicon carbide substrate.

8. The method of claim 7, wherein the preset tilting angle of the mesa is less than 20 degrees.

9. The method of claim 1, wherein the preset tilting angle of the mesa is less than 20 degrees.

10. A method for manufacturing a detector, comprising:
manufacturing a mesa on a chip by:
coating a photoresist layer on a mesa region of the chip;
heating the chip on which the photoresist layer is coated from a first preset temperature to a second preset temperature;
performing etching processing on the heated chip, so as to manufacture the mesa having a preset tilting angle; and
removing the photoresist layer on the mesa region of the chip after the mesa is manufactured;
manufacturing ohmic contact electrodes on ohmic contact electrode areas of the chip with the mesa; and
forming a passivation layer on a side surface of the mesa and an upper surface excluding the ohmic contact electrode areas of the chip with the manufactured ohmic contact electrodes; and
wherein heating the chip on which the photoresist layer is coated from the first preset temperature to the second preset temperature comprises:
heating the chip on which the photoresist layer is coated from the first preset temperature to the second preset temperature within 2-20 minutes, wherein the first preset temperature is in a range from 80° C. to 100° C., and the second preset temperature is in a range from 140° C. to 200° C.

11. The method of claim 10, wherein the passivation layer is one or more selected from a silicon oxide layer, an aluminum oxide layer, a chromium oxide layer, a yttrium oxide layer or a silicon nitride layer.

12. The method of claim 11, wherein a material of the ohmic contact electrodes is one or more selected from nickel, titanium, aluminum or gold.

13. The method of claim 10, wherein a thickness of the passivation layer is in a range from 50 nanometers to 500 nanometers.

14. The method of claim 13, wherein a material of the ohmic contact electrodes is one or more selected from nickel, titanium, aluminum or gold.

15. The method of claim 10, wherein a material of the ohmic contact electrodes is one or more selected from nickel, titanium, aluminum or gold.

* * * * *